United States Patent
Cheng et al.

(10) Patent No.: US 10,606,393 B2
(45) Date of Patent: Mar. 31, 2020

(54) MICRO LIGHT-EMITTING DIODE DISPLAY DEVICE

(71) Applicant: HANNSTOUCH SOLUTION INCORPORATED, Tainan (TW)

(72) Inventors: Chih-Jen Cheng, Tainan (TW); Ching-Feng Tsai, Tainan (TW)

(73) Assignee: HANNSTOUCH SOLUTION INCORPORATED, Tainan (TW)

(*) Notice: Subject to any disclaimer, the term of this patent is extended or adjusted under 35 U.S.C. 154(b) by 0 days.

(21) Appl. No.: 15/959,307

(22) Filed: Apr. 23, 2018

(65) Prior Publication Data

US 2019/0258346 A1    Aug. 22, 2019

(30) Foreign Application Priority Data

Feb. 22, 2018  (CN) .......................... 2018 1 0154080

(51) Int. Cl.
*G06F 3/041* (2006.01)
*G09G 3/32* (2016.01)
*H01L 27/12* (2006.01)
*G06F 3/044* (2006.01)

(52) U.S. Cl.
CPC ............. *G06F 3/0412* (2013.01); *G09G 3/32* (2013.01); *H01L 27/1214* (2013.01); *G06F 3/0443* (2019.05); *G06F 3/0446* (2019.05)

(58) Field of Classification Search
CPC ...... G06F 3/0412; G09G 3/32; H01L 27/1214
See application file for complete search history.

(56) References Cited

U.S. PATENT DOCUMENTS

| | | | | |
|---|---|---|---|---|
| 10,304,901 | B1* | 5/2019 | Xu .................... | G02B 5/201 |
| 2014/0339495 | A1* | 11/2014 | Bibl ..................... | H01L 33/504 |
| | | | | 257/13 |
| 2014/0367633 | A1* | 12/2014 | Bibl .................. | G02F 1/133603 |
| | | | | 257/13 |
| 2014/0367705 | A1* | 12/2014 | Bibl ....................... | H01L 33/44 |
| | | | | 257/88 |
| 2016/0154170 | A1* | 6/2016 | Thompson ........ | G02F 1/133603 |
| | | | | 362/609 |
| 2017/0068362 | A1* | 3/2017 | Den Boer ............ | G06F 3/0412 |
| 2017/0133357 | A1* | 5/2017 | Kuo ...................... | H01L 25/167 |
| 2018/0211945 | A1* | 7/2018 | Cok ..................... | G09G 3/2088 |

* cited by examiner

*Primary Examiner* — Kwang-Su Yang
(74) *Attorney, Agent, or Firm* — CKC & Partners Co., LLC

(57) ABSTRACT

A display device includes a display substrate, at least one micro light-emitting diode (LED) chip, and at least one reflective layer. The display substrate includes at least one sub-pixel circuit. The micro LED chip is electrically connected to the sub-pixel circuit. The micro LED chip is at least partially disposed between the reflective layer and the sub-pixel circuit.

16 Claims, 13 Drawing Sheets

MICRO LIGHT-EMITTING DIODE DISPLAY DEVICE

CROSS-REFERENCE TO RELATED APPLICATION

This application claims priority to China Application Serial Number 201810154080.4, filed Feb. 22, 2018, which is herein incorporated by reference in its entirety.

BACKGROUND

Technical Field

The present disclosure relates to a display device.

Description of Related Art

Light-emitting diode (LED) display, which is also referred to as a micro-LED display, is fabricated by bonding plural micro-LED chips onto a thin-film transistor (TFT) circuit through package bonding technology, such that the LED display has a self-luminous property.

Through the configuration, the backlight module may be omitted in the LED display, such that the volume and weight of the LED display may be reduced, and the LED display gets thinner. In addition, the LED display has advantages on high material stability, long life time, high brightness, nano-second-level high speed response, and high-speed modulation and signal loading. Therefore, the LED display has become the mainstream of new display devices.

SUMMARY

According to some embodiments of the present disclosure, lights emitted from micro LED chips are reflected by a reflective layer and transmitted through a backside of a display substrate. Herein, a touch sensing layer may be designed on the backside of the display substrate, thereby omitting additional configuration for substrates. In addition, a package layer may be designed with micro-structures such that the reflective layer has micro-structures, thereby increasing the utilization rates of lights.

According to some embodiments of the present disclosure, a display device is provided. The display device includes a display substrate, at least one micro light-emitting diode (LED) chip, and at least one reflective layer. The display substrate includes at least one sub-pixel circuit. The micro LED chip is electrically connected to the sub-pixel circuit. The micro LED chip is at least partially disposed between the reflective layer and the sub-pixel circuit.

In some embodiments, the display device further includes a transparent cover, and the display substrate is between the transparent cover and the micro LED chip.

According to some embodiments of the present disclosure, a display device is provided. The display device includes a display substrate, at least one micro LED chip, a light-shielding layer, and at least one reflective layer. The display substrate includes at least one sub-pixel circuit. The at least one micro LED chip is electrically connected to the at least one sub-pixel circuit. The light-shielding layer has at least one opening corresponding to the at least one sub-pixel circuit. The reflective layer is in contact with the light-shielding layer, in which the opening of the light-shielding layer exposes the reflective layer.

DETAILED DESCRIPTION

Figure 1A:
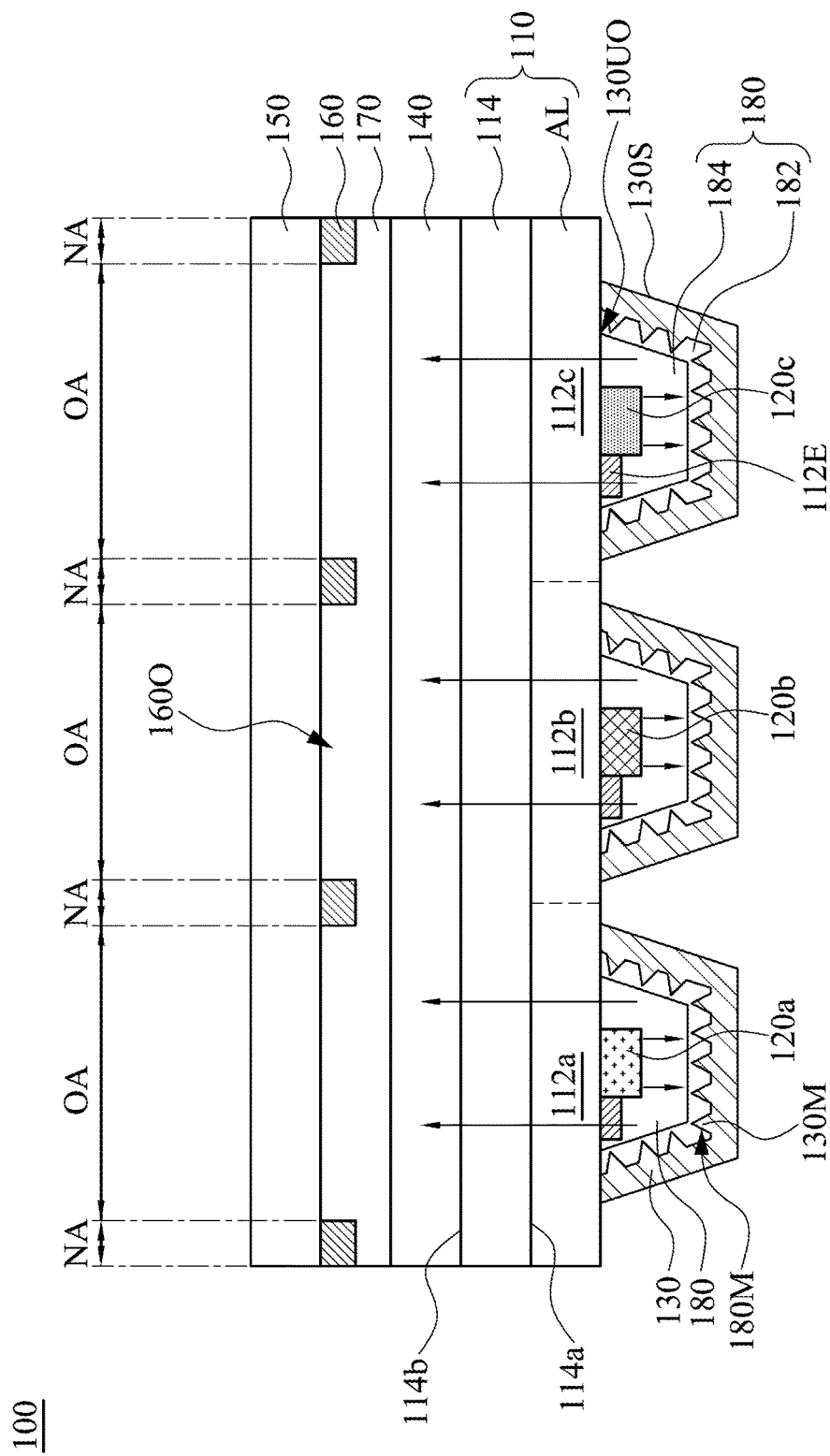
FIG. 1A is a cross-sectional view of a display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terms "micro" LED (light-emitting diode) chip as used herein may refer to the descriptive size of certain devices or devices in the scale of 1 micrometer to 100 micrometers in accordance with embodiments of the present disclosure. For example, the diameter or the length of the "micro" LED chip is less than 5 micrometers. Furthermore, the diameter or the length of the "micro" LED chip is less than 2.5 micrometers. However, it is to be appreciated that embodiments of the present disclosure are not necessarily so limited, and that certain aspects of the embodiments may be applicable to larger, and possibly smaller size scales.

FIG. 1A is a cross-sectional view of a display device 100 according to some embodiments of the present disclosure. The display device 100 includes a display substrate 110, plural micro light-emitting diode (LED) chips 120a-120c, and reflective layers 130. The display substrate 110 includes plural sub-pixel circuits 112a-112c. The micro LED chips 120a-120c are disposed on the sub-pixel circuits 112a-112c, respectively. The micro LED chips 120a-120c are disposed between the reflective layers 130 and the sub-pixel circuits 112a-112c, respectively.

Through the configuration, lights emitted from the micro LED chips 120a-120c are reflected by the reflective layers 130 and exit through the display substrate 110, so as to realize backside illumination. In some embodiments, the display substrate 110 may be a supporting substrate holding other devices or configured to provide additional functions, so as to reduce the number of substrates.

To be specific, the display substrate 110 includes a substrate 114 and an array control circuit AL. The substrate 114 has a surface 114a and a surface 114b, in which the surface 114a is closer to the micro LED chips 120a-120c than the surface 114b is. The array control circuit AL is disposed on the surface 114a of the substrate 114. The sub-pixel circuits 112a-112c are disposed in the array control circuit AL and have electrodes 112E. The array control circuit AL is capable of independently controlling the electrodes 112E of the respective sub-pixel circuits 112a-112c. The electrodes 112E of the respective sub-pixel circuits 112a-112c are electrically connected to the corresponding micro LED chips 120a-120c. Through the configuration, the array control circuit AL is capable of independently controlling the micro LED chips 120a-120c.

In some embodiments, the micro LED chips 120a-120c emit lights in a direction away from the array control circuit AL (referring to the short arrows). Through the configuration of the reflective layers 130, the lights emitted by the micro LED chips 120a-120c are reflected by the reflective layers 130, transmitted through the array control circuit AL, enter the substrate 114 of the display substrate 110 through the surface 114a, and exit from the surface 114b of the substrate 114 (referring to the long arrows).

Herein, the micro LED chips 120a-120c are directly bonded onto the electrodes 112E. For example, a flip chip technology is performed such that the micro LED chips 120a-120c are bonded with the electrodes 112E of the sub-pixel circuits 112a-112c, but it should not limit the scope of the present disclosure. In some other embodiments, the micro LED chips 120a-120c are bonded with the electrodes 112E of the sub-pixel circuits 112a-112c through surface-mount technology (SMT) or wire-bonding technology. In some embodiments, the array control circuit AL may be a thin-film transistor circuit formed of a transparent conductive material and a transparent insulating layer. For example, the transparent conductive material of the array control circuit AL may be indium tin oxide (ITO). The electrodes 112E may also be formed of the transparent conductive material, such as ITO. Herein, a transmittance of the transparent conductive material may be greater than 80%, such that the transparent conductive material is prevented from shielding the lights emitted by the micro LED chips 120a-120c. Of course, it should not limit the scope of the present disclosure. In some embodiments, the array control circuit AL may be formed of a metal layer (or a transparent conductive layer) and a transparent insulating layer. For example, the electrodes 112E may be formed of metal.

Figure 1B:
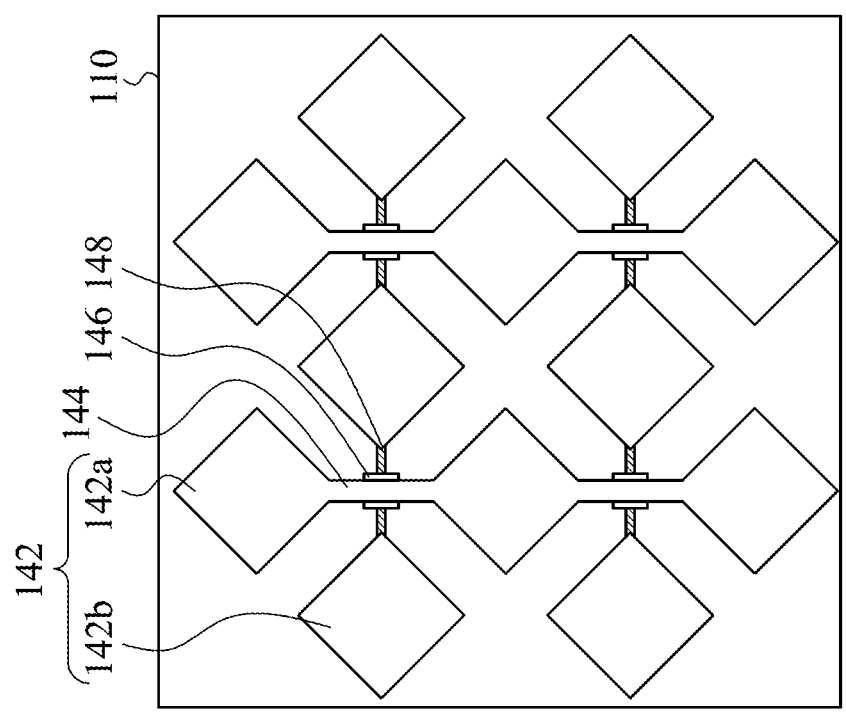
FIG. 1B is a top view of a touch sensing layer of the display device of FIG. 1A in some embodiments.

In some embodiments of the present disclosure, the display device 100 may further include a touch sensing layer 140, a transparent cover 150, and a light-shielding layer 160. The touch sensing layer 140 is on a side of the display substrate 110 opposite the micro LED chips 120a-120c. Herein, the touch sensing layer 140 may be disposed on the surface 114b of the substrate 114 of the display substrate 110. Reference is made to both FIG. 1A and FIG. 1B. FIG. 1B is a top view of the touch sensing layer 140 of the display device 100 of FIG. 1A in some embodiments. For example, touch sensing electrodes 142 of the touch sensing layer 140 may be in contact with the surface 114b of the substrate. The touch sensing electrodes 142 may be formed of a transparent conductive material by suitable deposition and patterning processes. For example, ITO is deposited on the surface 114b of the substrate 114, and then lithography and etching processes are performed to the ITO, and the touch sensing electrodes are formed. The touch sensing layer 140 may have a single-layer configuration or a two-layer configuration for the touch sensing electrodes. For example, herein, the touch sensing layer 140 may has a single-layer configuration for the touch sensing electrodes. The touch sensing electrodes 142 includes touch sensing electrodes 142a and 142b. The touch sensing layer 140 further includes connecting lines 144, isolation blocks 146, and bridging wires 148.

The connecting lines 144 connect adjacent touch sensing electrodes 142a to each other, such that vertical electrode series are formed. The bridging wires 148 connect adjacent touch sensing electrodes 142b to each other, such that horizontal electrode series are formed. The isolation blocks 146 are between the connecting lines 144 and the bridging wires 148, and electrically isolate the vertical electrode series from the horizontal electrode series.

The transparent cover 150 is on the side of the display substrate 110 opposite the micro LED chips 120a-120c, such that the display substrate 110 is between the transparent cover 150 and the micro LED chips 120a-120c. The light-shielding layer 160 is between the transparent cover 150 and the display substrate 110. The light-shielding layer 160 may be formed by suitable opaque materials, such as black inks. For example, a transmittance of the light-shielding layer 160 is less than 20%. The light-shielding layer 160 covers a portion of the display substrate 110, and does not cover at least a portion of each of the sub-pixel circuits 112a-112c. The light-shielding layer 160 has openings 160O defining opening areas OA and non-opening areas NA at at least one side of the opening areas OA. Each of the sub-pixel circuits 112a-112c is at least partially in the corresponding opening areas OA.

In some embodiments of the present disclosure, the light-shielding layer 160 may include plural openings 160O for exposing the respective sub-pixel circuits 112a-112c, such that the micro LED chips 120a-120c are respectively disposed in different opening areas OA. Of course, it should not limit the scope of the present disclosure, in some other embodiments, the sub-pixel circuits 112a-112c and the micro LED chips 120a-120c are in the same opening area OA (referring to FIG. 3).

Through the configuration of the touch sensing layer 140, the display device 100 may be a touch display panel. While the touch sensing layer 140 is directly disposed on the display substrate 110, the number of substrates can be reduced, thereby decreasing the overall thickness of the display device 100. It should be noted that, the touch sensing layer 140, the transparent cover 150, and the light-shielding layer 160 are optional configurations. In some embodiments, the touch sensing layer 140, the transparent cover 150, and the light-shielding layer 160 may be optionally omitted. Herein, for facilitating the bonding between the transparent cover 150 and the display substrate 110, the display device 100 may include an optical adhesive 170 between the transparent cover 150 and the display substrate 110. It is noted that the optical adhesive 170 is an optional configuration. In some embodiments, the optical adhesive 170 may be omitted.

In some embodiments of the present disclosure, the display device 100 further includes package layers 180 between the micro LED chips 120a-120c and the reflective layers 130. In some embodiments, the materials of the package layer 180 may be suitable dielectric materials, such as silicon dioxide, epoxy, or polystyrene (PS). Herein, the package layers 180 wrap around the micro LED chips 120a-120c, respectively, and the package layers 180 are separated from each other. The package layers 180 may be formed by glue dispensing or other methods. In some embodiments, the sidewalls of the package layers 180 may have an angle in a range of about 10 degrees to about 70 degrees with respect to the substrate 114. For example, the angle is in a range of 30 degrees to 50 degrees. In some embodiments, the package layers 180 may include plural layers. For example, one of the package layers 180 may include a first package layer 182 and a second package layer 184 having a material different from that of the first package layer 182. The water vapor transmission rate (WVTR) of the first package layer 182 is less than that of the second package layer 184. For example, the first package layer 182 may be a water vapor barrier layer 182, which may include organic or inorganic materials, such as $SiO_xN_y$, for blocking the water vapor. In some other embodiments, the water vapor transmission rate (WVTR) of the second package layer 184 may be designed to be less than that of the first package layer 182.

In some embodiments of the present disclosure, the package layers 180 include plural micro-structures 180M thereon, which may be formed by laser, plasma, or etching processes. Herein, the micro-structures 180M are recessed micro-structures. However, it should not limit the scope of the present disclosure. In some other embodiments, the micro-structures 180M may be protruding micro-structures. Herein, the examples are illustrated with the configuration that the first package layer 182 has the micro-structures 180M. However, it should not limit the scope of the present disclosure. In some other embodiments, both the first package layer 182 and the second package layer 184 have the micro-structures 180M.

The reflective layers 130 are formed over the package layers 180 and have the reflective micro-structures 130M. In some embodiments, the reflective layers 130 are over the package layers 180 and fill the recessed micro-structures 180M, thereby forming the corresponding protruding reflective micro-structures 130M. Alternatively, in some other embodiments, the reflective layers 130 cover the protruding micro-structures 180M, thereby forming the corresponding recessed reflective micro-structures 130M.

The configuration of the micro-structures 180M and the reflective micro-structures 130M may concentrate reflected lights, thereby increasing the utilization rate of the lights. Herein, the positions and shapes of the micro-structures 180M and the reflective micro-structures 130M may be adjusted according to the actual requirements, and not limited by those shown in figures. For example, the density of the micro-structures 180M and the reflective micro-structures 130M may vary according their positions. The cross-sectional shapes of the micro-structure 180M and the reflective micro-structure 130M may be semi-circles, trapezoids, and so on, and not limited to the triangles shown in the figure.

In some embodiments, for increasing the utilization rate of lights, an upper opening of the reflective layer 130 may be fully in the opening area OA. That is, a projection of the upper opening of the reflective layer 130 on the substrate 114 is out of the projection of the light-shielding layer 160 on the substrate 114. An area of the opening area OA is greater than an area of the upper opening 130UO of the reflective layer 130. Through the configuration, the lights emitted from the micro LED chips are reflected by the reflective layer 130, exit from the upper opening of the reflective layer 130, and transmit through the display substrate 110 and the touch sensing layer 140. Most of the lights can transmit through the opening 160O of the light-shielding layer 160 without being blocked by the light-shielding layer 160, and exit from the transparent cover 150.

Herein, materials of the reflective layers 130 may be silver, copper, aluminum, nickel, and so on. The reflectance of the reflective layers 130 may be greater than 60%, preferably, greater than 80%. The reflective layers 130 may be formed by deposition methods. Herein, outer surfaces 130S of the reflective layers 130 are not influenced by the shape of the package layers 180. In some other embodiments, the reflective layers 130 may have a surface topography corresponding to the surface topography of the package layers 180. In other words, the reflective layers 130 may be conformally disposed on the package layers 180. Therefore, the outer surfaces 130S of the reflective layers 130 may have shapes similar to those of the micro-structures 180M.

Herein, the cross-sectional shape of the reflective layers 130 is similar with that of the package layers 180. For example, the shapes of the reflective layers 130 and the package layers 180 are trapezoids. However, it should not limit the scope of the present disclosure. The cross-sectional shapes of the reflective layers 130 and the package layers 180 may be any suitable shapes.

In some embodiments of the present disclosure, the micro LED chips 120a-120c have different emission spectrums. To be specific, the micro LED chips 120a-120c have greatest light intensities at different wavelengths (or colors), respectively. For example, the micro LED chip 120a may be a red micro LED chip configured to emit light in red spectrum; the micro LED chip 120b may be a green micro LED chip configured to emit light in a green spectrum; and the micro LED chip 120c may be a blue micro LED chip configured to emit light in a blue spectrum. It should be noted that, the examples are illustrated with the three kinds of the micro LED chips 120a-120c herein, but it should not limit the scope of the present disclosure. In other embodiments, the examples may be illustrated with only two kinds of micro LED chips. In some other embodiments, a combination of the color filter film and micro LED chips that have the same emission spectrum may also generate various suitable colors.

Figure 2:
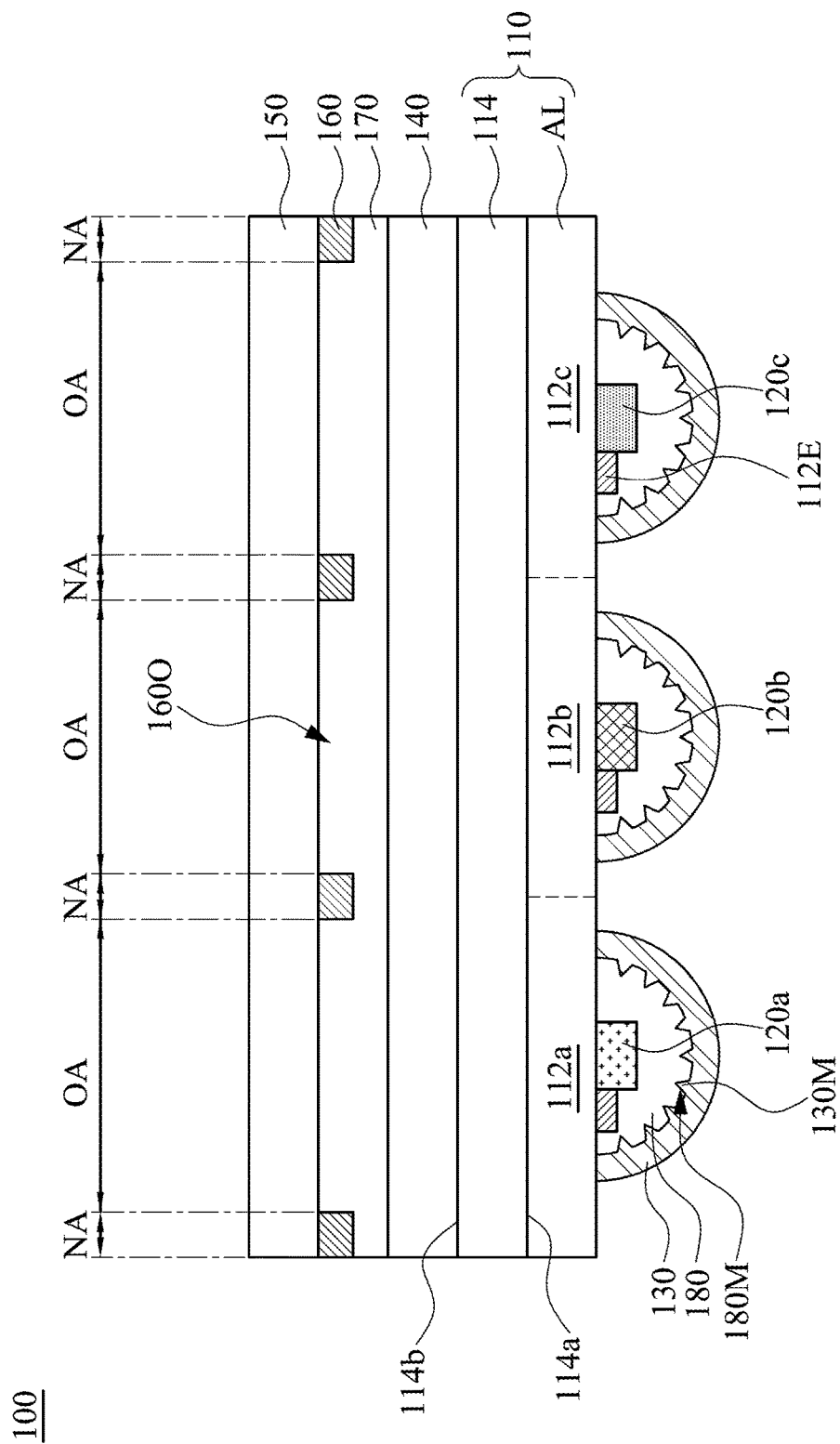
FIG. 2 is a cross-sectional view of a display device according to some embodiments of the present disclosure.

FIG. 2 is a cross-sectional view of a display device 100 according to some embodiments of the present disclosure. The present embodiments are similar to that of FIG. 1, and the difference between the present embodiments and that of FIG. 1 is that: in the present embodiments, the cross-sectional shapes of the reflective layers 130 and the package layers 180 are semi-circles. In other embodiments, the cross-sectional shapes of the reflective layers 130 and the package layers 180 may be semi-ellipse. Other details of the present embodiments are similar to those aforementioned, and not repeated herein.

Figure 3:
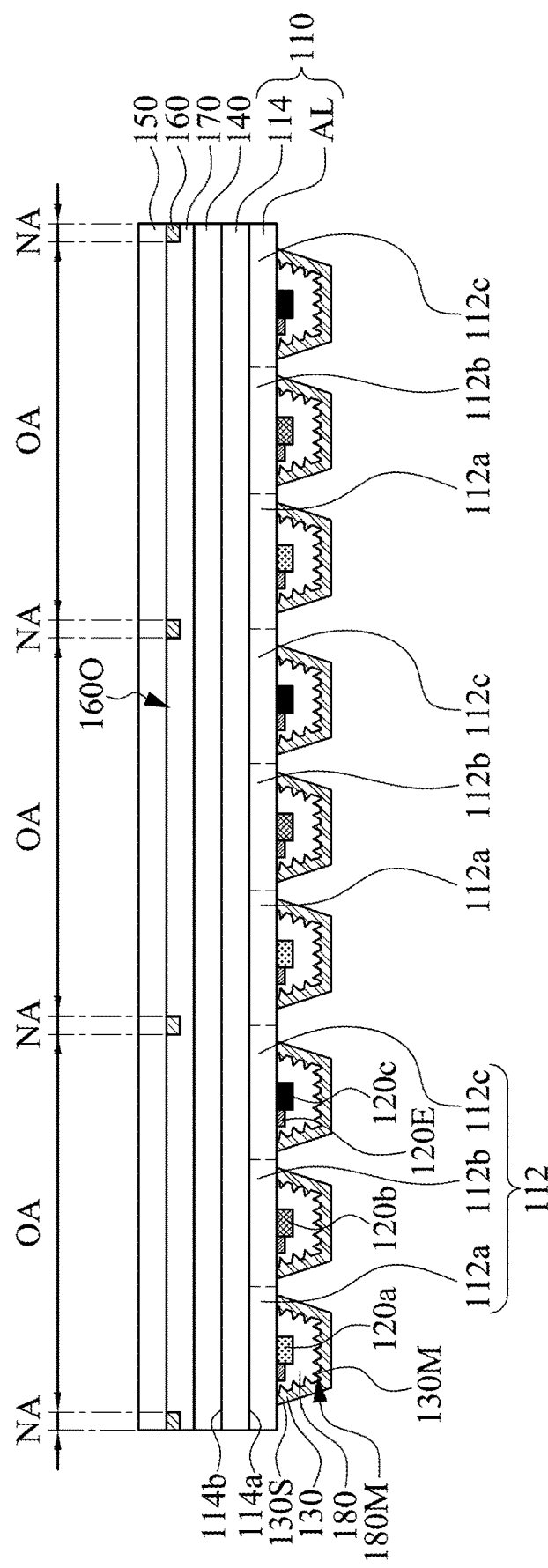
FIG. 3 is a cross-sectional view of a display device according to some embodiments of the present disclosure.

FIG. 3 is a cross-sectional view of a display device 100 according to some embodiments of the present disclosure. The present embodiments are similar to that of FIG. 1, and the difference between the present embodiments and that of FIG. 1 is that: in the present embodiments, the plural openings 160O of the light-shielding layer 160 expose the pixel circuits 112, respectively, in which each of the pixel circuits 112 includes a set of sub-pixel circuits 112a-112c. That is, the plural openings 160O of the light-shielding layer 160 respectively expose sets of the sub-pixel circuits 112a-112c. Herein, each set of the micro LED chips 120a-120c is disposed corresponding to each set of the sub-pixel circuits 112a-112c, and therefore each set of the micro LED chips 120a-120c and the corresponding set of the sub-pixel circuits 112a-112c are disposed in the same opening area OA. The light-shielding layer 160 is between two adjacent pixels, and thereby distinguishing lights of the two adjacent pixels. Other details of the present embodiments are similar to those aforementioned, and not repeated herein.

Figure 4:
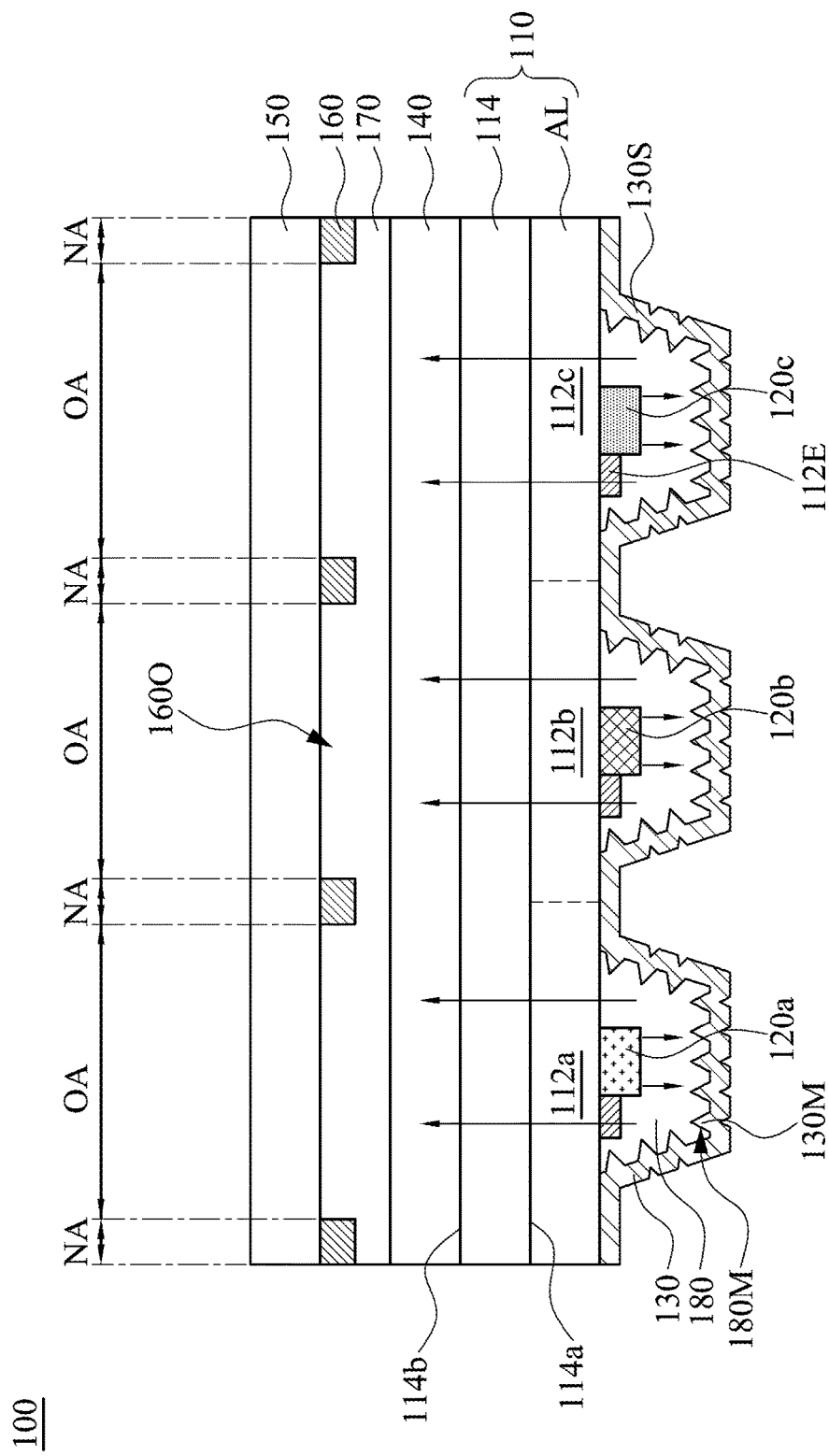
FIG. 4 is a cross-sectional view of a display device according to some embodiments of the present disclosure.

FIG. 4 is a cross-sectional view of a display device 100 according to some embodiments of the present disclosure. The present embodiments are similar to that of FIG. 1, and the difference between the present embodiments and that of FIG. 1 is that: in the present embodiments, the reflective layer 130 is conformally disposed on the package layers 180, such that the outer surface 130S of the reflective layer 130 has similar shapes with those of the micro-structures 180M. For example, as the micro-structures 180M have recessed triangular cross-sectional shapes, the outer surface 130S of the reflective layer 130 also have the recessed triangular cross-sectional shapes. In addition, in the present embodiments, it can be described as that, the reflective layers 130 covering the respective micro LED chips 120a-120c are connected with each other. Other details of the present embodiments are similar to those aforementioned, and not repeated herein.

Figure 5:
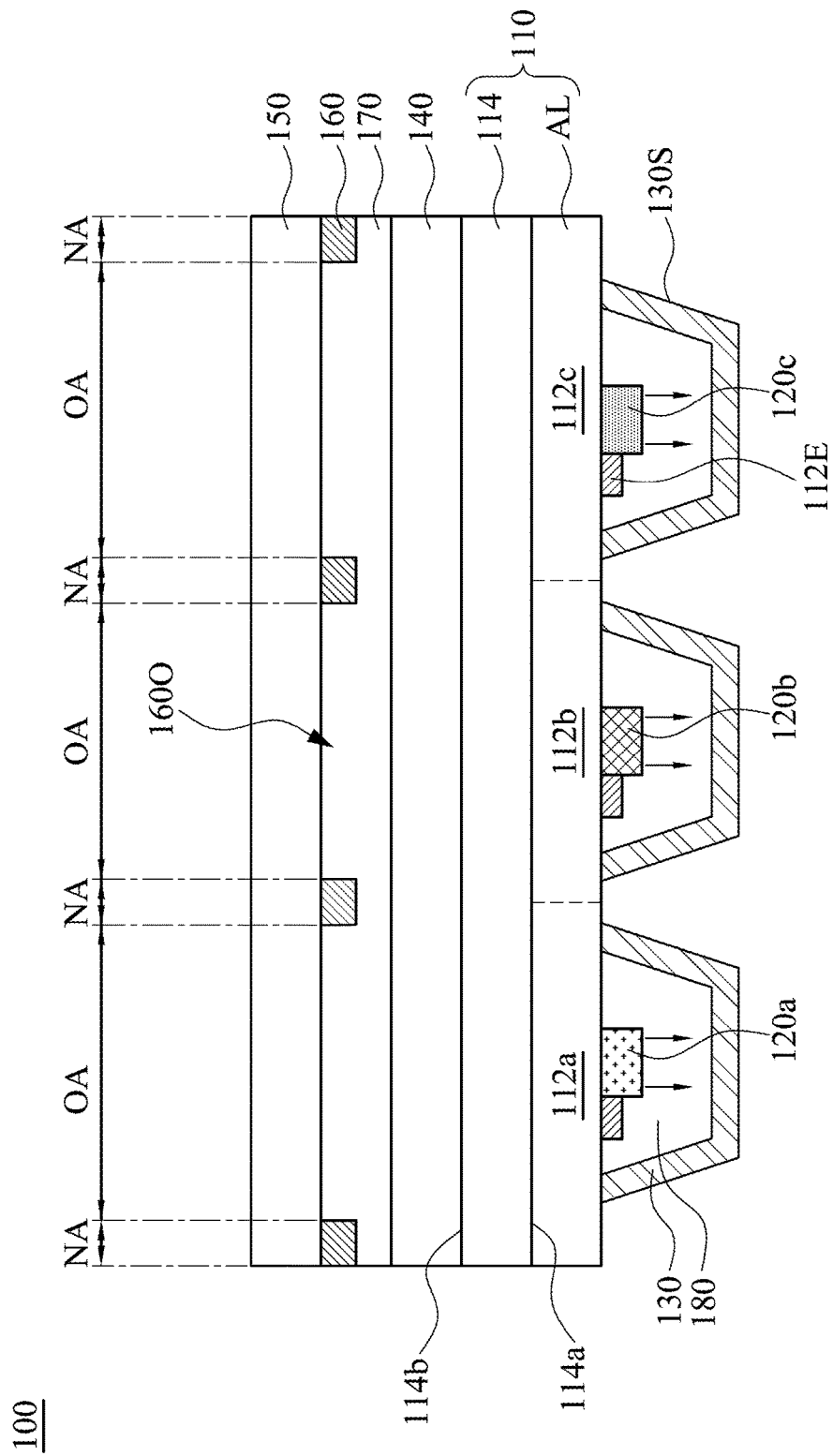
FIG. 5 is a cross-sectional view of a display device according to some embodiments of the present disclosure.

FIG. 5 is a cross-sectional view of a display device 100 according to some embodiments of the present disclosure. The present embodiments are similar to that of FIG. 1, and the difference between the present embodiments and that of FIG. 1 is that: in the present embodiments, the package layers 180 do not include the micro-structures 180M, and the reflective layers 130 do not include the reflective micro-structures 130M. In the present embodiments, the reflective layers 130 are conformally disposed on the outer side of the package layers 180. Other details of the present embodiments are similar to those aforementioned, and not repeated herein.

Figure 6:
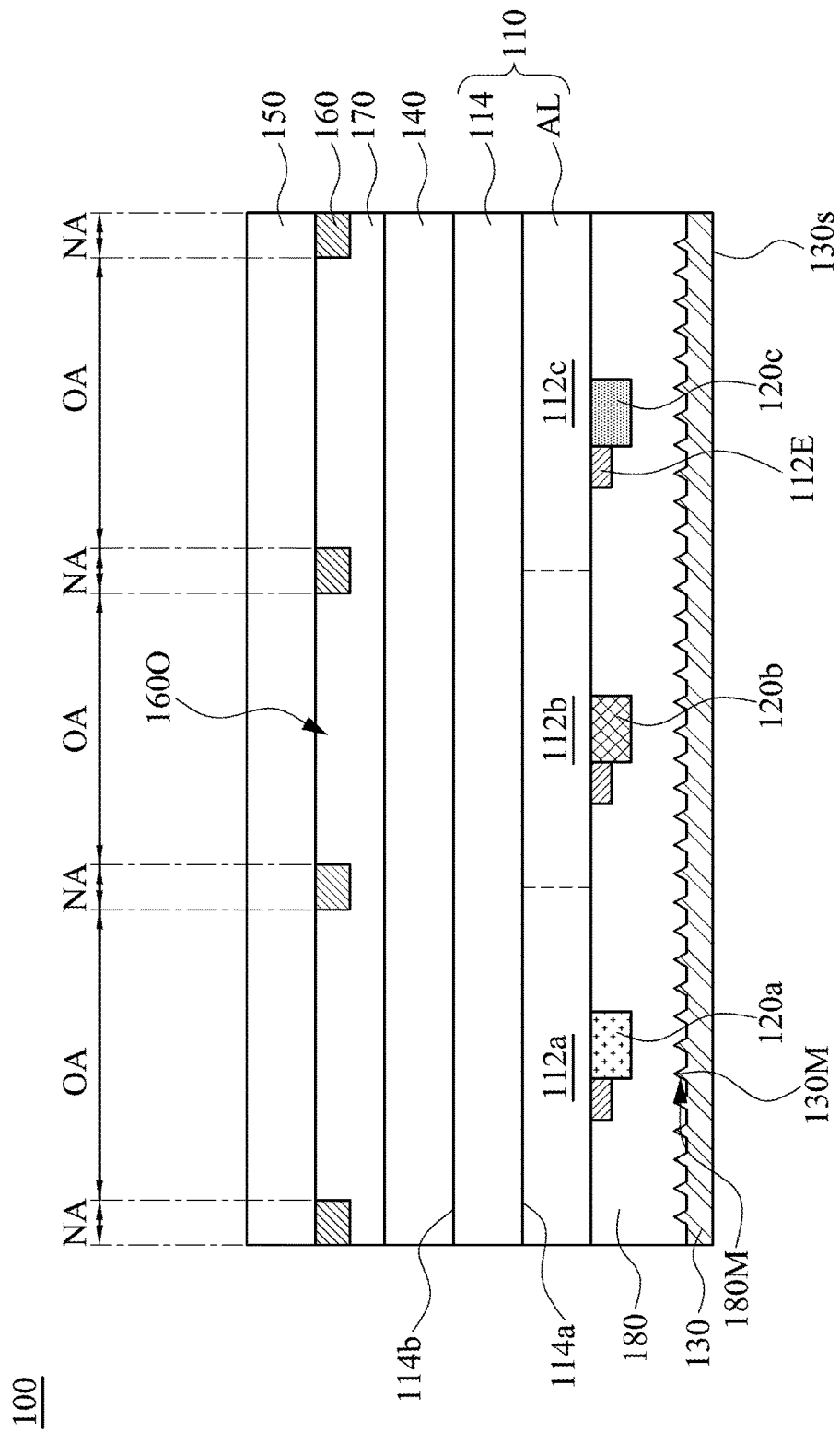
FIG. 6 is a cross-sectional view of a display device according to some embodiments of the present disclosure.

FIG. 6 is a cross-sectional view of a display device 100 according to some embodiments of the present disclosure. The present embodiments are similar to that of FIG. 1, and the difference between the present embodiments and that of FIG. 1 is that: in the present embodiments, a single layer of the package layer 180 wraps around the plural micro LED chips 120a-120c.

As mentioned previously, the package layer 180 has plural micro-structures 180M, such that the reflective layer 130 has the reflective micro-structures 130M. Herein, the micro-structures 180M and the micro-structures 130M are arranged in horizontal direction. Although it is not depicted in the figure, the density of the micro-structures 180M and the micro-structures 130M may vary in the horizontal direction.

It should be noted that, in some other embodiments, the package layer 180 does not include the micro-structures 180M, such that the reflective layer 130 does not include the reflective micro-structures 130M. In the present embodiments, it can be described as that, the reflective layers 130 covering the respective micro LED chips 120a-120c are connected with each other. Herein, by a film attaching method, a reflective layer 130 may be directly attached to the package layer 180 through an adhesive. Other details of the present embodiments are similar to those aforementioned, and not repeated herein.

Figure 7:
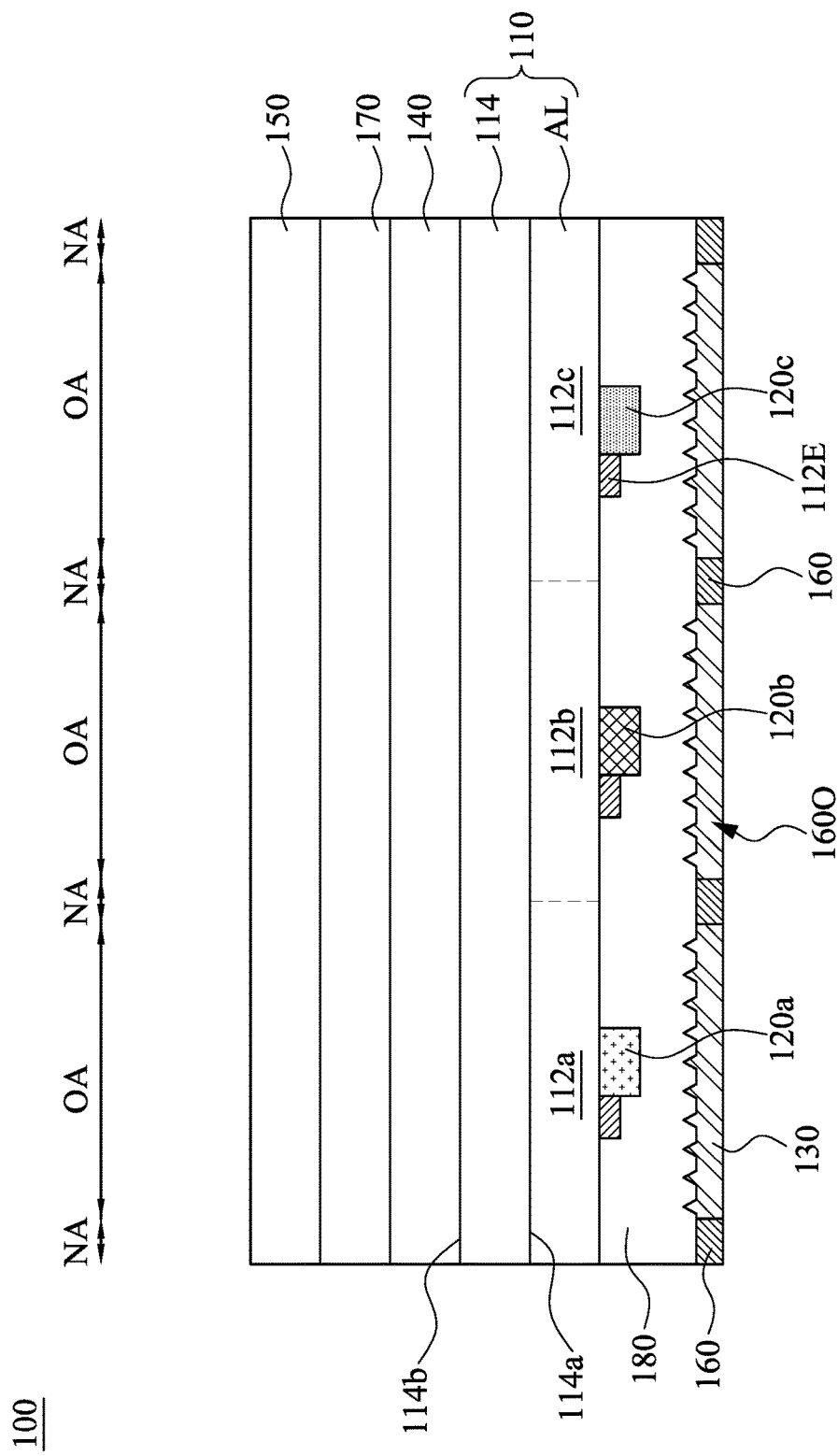
FIG. 7 is a cross-sectional view of a display device according to some embodiments of the present disclosure.

FIG. 7 is a cross-sectional view of a display device 100 according to some embodiments of the present disclosure. The present embodiments are similar to that of FIG. 6, and the difference between the present embodiments and that of FIG. 6 is that: in the present embodiments, the light-shielding layer 160 is on a side of the substrate 114 away from the transparent cover 150. Herein, the light-shielding layer 160 is disposed in the reflective layer 130. For example, the reflective layer 130 has openings therein, and the light-shielding layer 160 is disposed in the openings. Alternatively, the reflective layers 130 are disposed in the openings 160O of the light-shielding layer 160, respectively. It should not limit the scope of the present disclosure. In some other embodiments, the light-shielding layer 160 may be on a side of the reflective layer 130 away from the micro LED chips 120a-120c. For example, the light-shielding layer 160 may be on the reflective layer 130. Through the configuration, color mixing is prevented.

In some embodiments, by oxidation reaction, some portions of the reflective layer 130 are blackened, and turned into the light-shielding layers 160. In some other embodiments, the light-shielding layers 160 may be formed by methods such as etching and deposition. The light-shielding layers 160 may be between two adjacent sub-pixel circuits 112a-112c for preventing color mixing. The reflective layer 130 and the light-shielding layers 160 are formed at the same layer herein, but it should not limit the scope of the present disclosure. In other embodiments, the light-shielding layers 160 are over the reflective layer 130.

Figure 8:
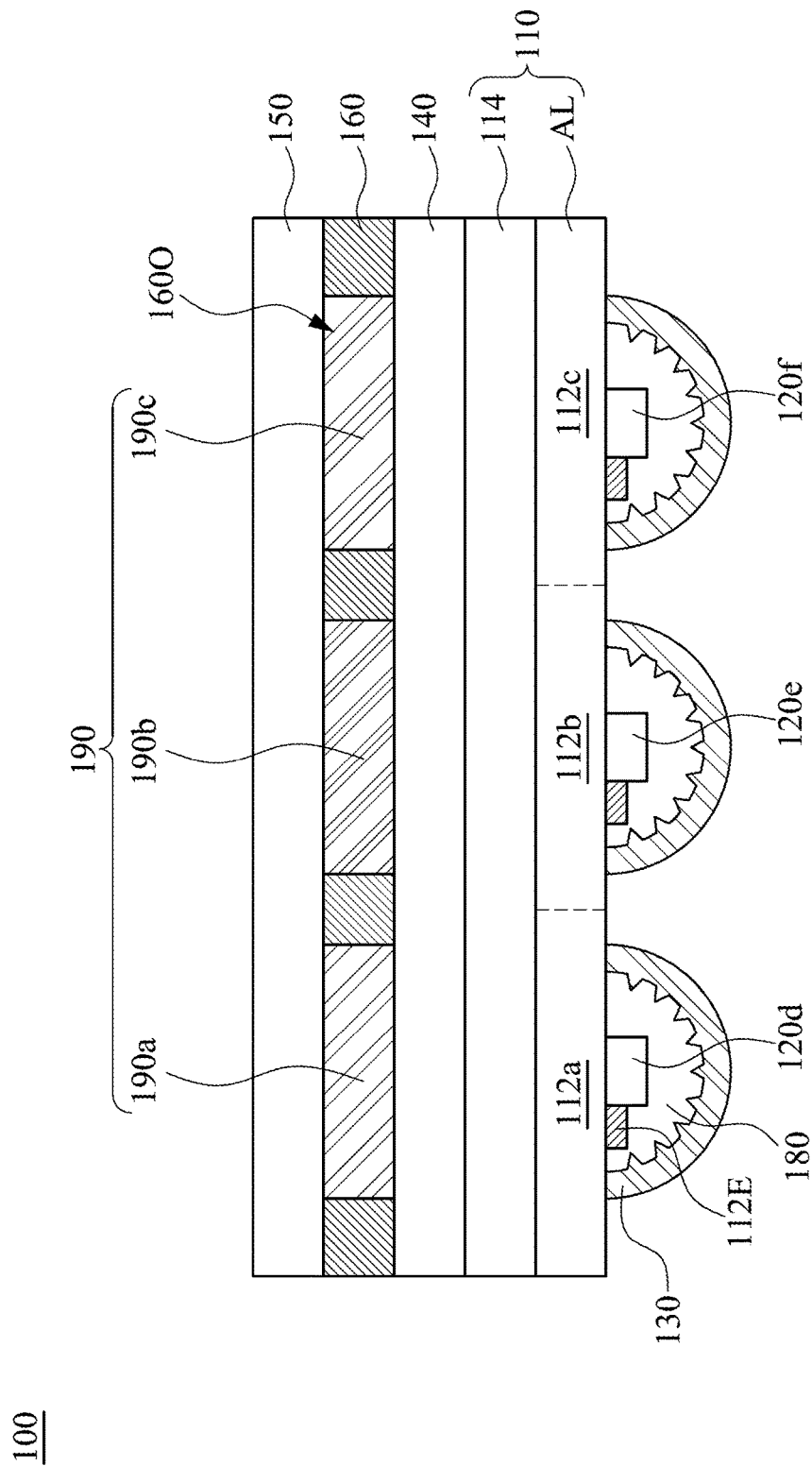
FIG. 8 is a cross-sectional view of a display device according to some embodiments of the present disclosure.

FIG. 8 is a cross-sectional view of a display device 100 according to some embodiments of the present disclosure. The present embodiments are similar to that of FIG. 1, and the difference between the present embodiments and that of FIG. 1 is that: in the present embodiments, the display device 100 further includes a color filter film 190. The color filter film 190 includes color filter units 190a-190c, in which the sub-pixel circuits 112a-112c are respectively disposed corresponding to the color filter units 190a-190c. The color filter units 190a-190c have different transmittance spectrums. For example, the color filter unit 190a has a red light transmittance spectrum, the color filter unit 190b has a green light transmittance spectrum, and the color filter unit 190c has a blue light transmittance spectrum. In some embodiments of the present disclosure, the display device 100 includes micro LED chips 120d-120f respectively over the sub-pixel circuits 112a-112c. The micro LED chips 120d-120f may have the same emission spectrum.

In some embodiments, through the color filter units 190a-190c of different colors, the lights (which originally have the same color) may be modulated by the color filter units 190a-190c and therefore have different colors. As such, it is not required to design the display device 100 to have the micro LED chips having different emission spectrums as aforementioned embodiments.

For example, in some embodiments, the micro LED chips 120d-120f may be micro blue LED chips, in which the package layers 180 thereof are doped with yellow fluorescent powders, such that the blue lights emitted from the micro LED chips 120d-120f are turned to white lights by the package layers 180.

Herein, in order to prevent the light emitted from the micro LED chips 120d-120f from color mixing after passing through the color filter units 190a-190c, the light-shielding layer 160 is designed to shield borders of the sub-pixel circuits 112a-112c (or borders of the color filter units 190a-190c). For example, the color filter units 190a-190c are respectively in the openings 160O of the light-shielding layer 160.

Other details of the present embodiments are similar to those aforementioned, and not repeated herein.

Figure 9:
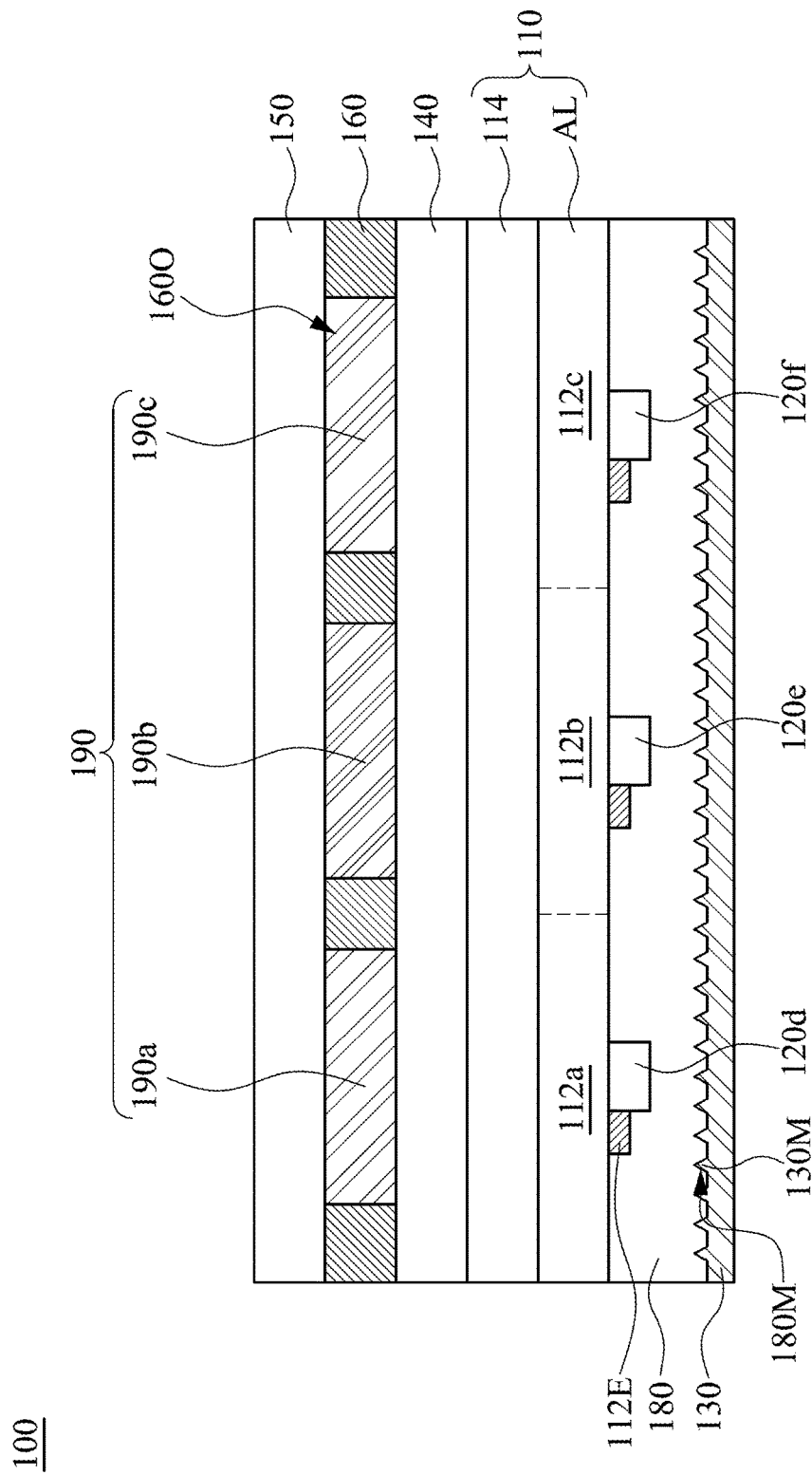
FIG. 9 is a cross-sectional view of a display device according to some embodiments of the present disclosure.

FIG. 9 is a cross-sectional view of a display device 100 according to some embodiments of the present disclosure. The present embodiments are similar to that of FIG. 5, and the difference between the present embodiments and that of FIG. 5 is that: in the present embodiments, a single layer of the package layer 180 wraps around the micro LED chips 120d-120f.

As aforementioned, the package layer 180 has micro-structures 180M, and the reflective layer 130 has the reflective micro-structures 130M. Herein, the micro-structures 180M and the reflective micro-structures 130M are arranged in horizontal direction. Although it is not depicted in the figure, the density of the micro-structures 180M and the reflective micro-structures 130M may vary in the horizontal direction. In some other embodiments, the package layer 180 does not have the micro-structures 180M, such that the reflective layer 130 does not have the reflective micro-structures 130M. In the present embodiments, it can be described as that, the reflective layers 130 covering the respective micro LED chips 120a-120c are connected with each other. Herein, by a film attaching method, a reflective layer 130 may be directly attached to the package layer 180. Other details of the present embodiments are similar to those aforementioned, and not repeated herein.

Figure 10:
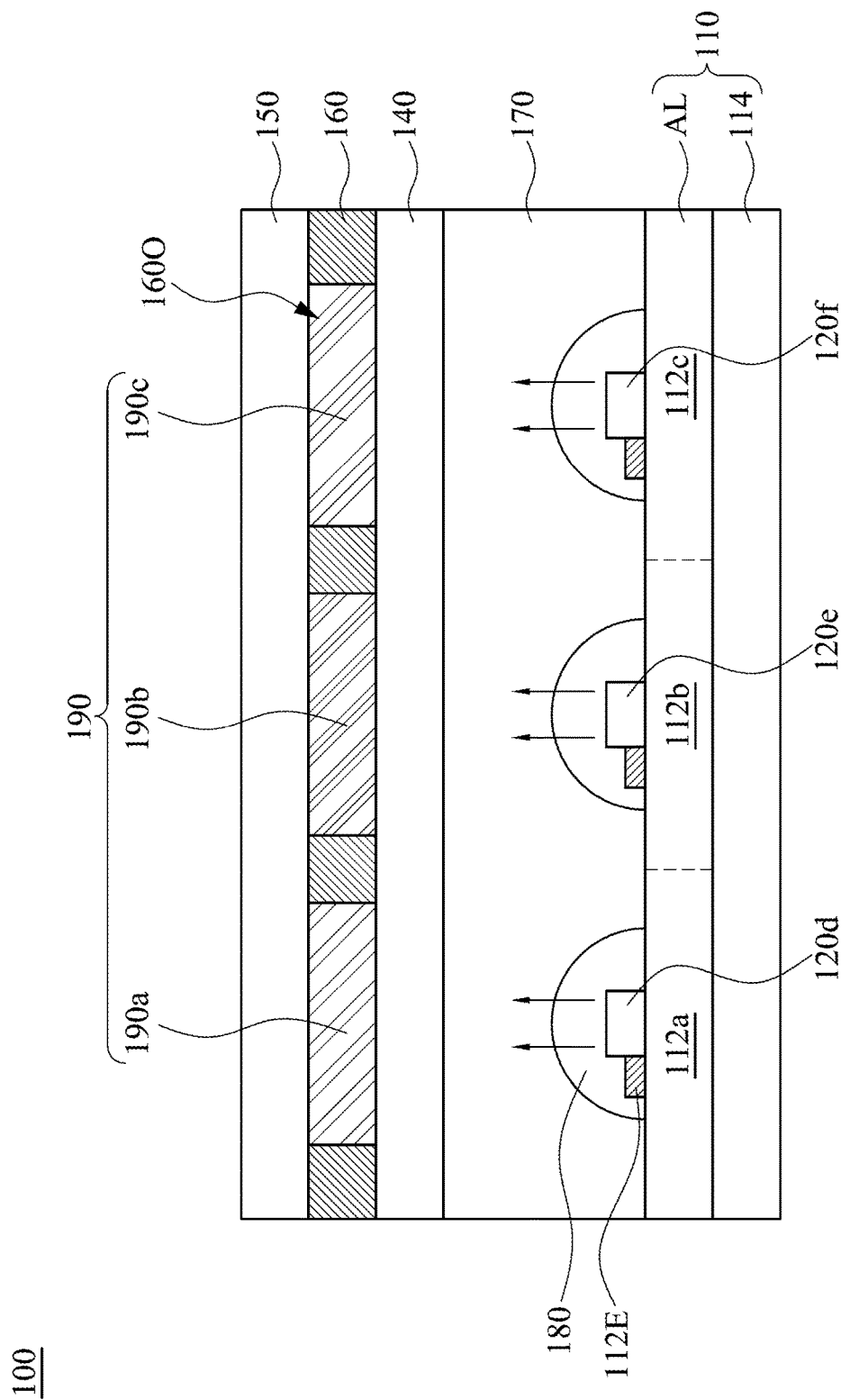
FIG. 10 is a cross-sectional view of a display device according to some embodiments of the present disclosure.

FIG. 10 is a cross-sectional view of a display device 100 according to some embodiments of the present disclosure. The present embodiments are similar to that of FIG. 5, and the difference between the present embodiments and that of FIG. 5 is that: in the present embodiments, the micro LED chips 120d-120f are on a side of the display substrate 110 facing the transparent cover 150. Lights are transmitted to the transparent cover 150 directly, and do not pass through the substrate 114 of the display substrate 110.

In the present embodiments, the micro LED chips 120d-120f may have the same emission spectrum. Through the color filter units 190a-190c of different colors, the lights (which originally have the same color) may be modulated by the color filter units 190a-190c and therefore have different colors. As such, it is not required to design the display device 100 to have the micro LED chips having different emission spectrums as aforementioned embodiments. For example, in some embodiments, the micro LED chips 120d-120f may be micro blue LED chips, in which the package layers 180 thereof are doped with yellow fluorescent powders, such that the blue lights emitted from the micro LED chips 120d-120f are turned to white lights by the package layers 180.

Other details of the present embodiments are similar to those aforementioned, and not repeated herein.

Figure 11:
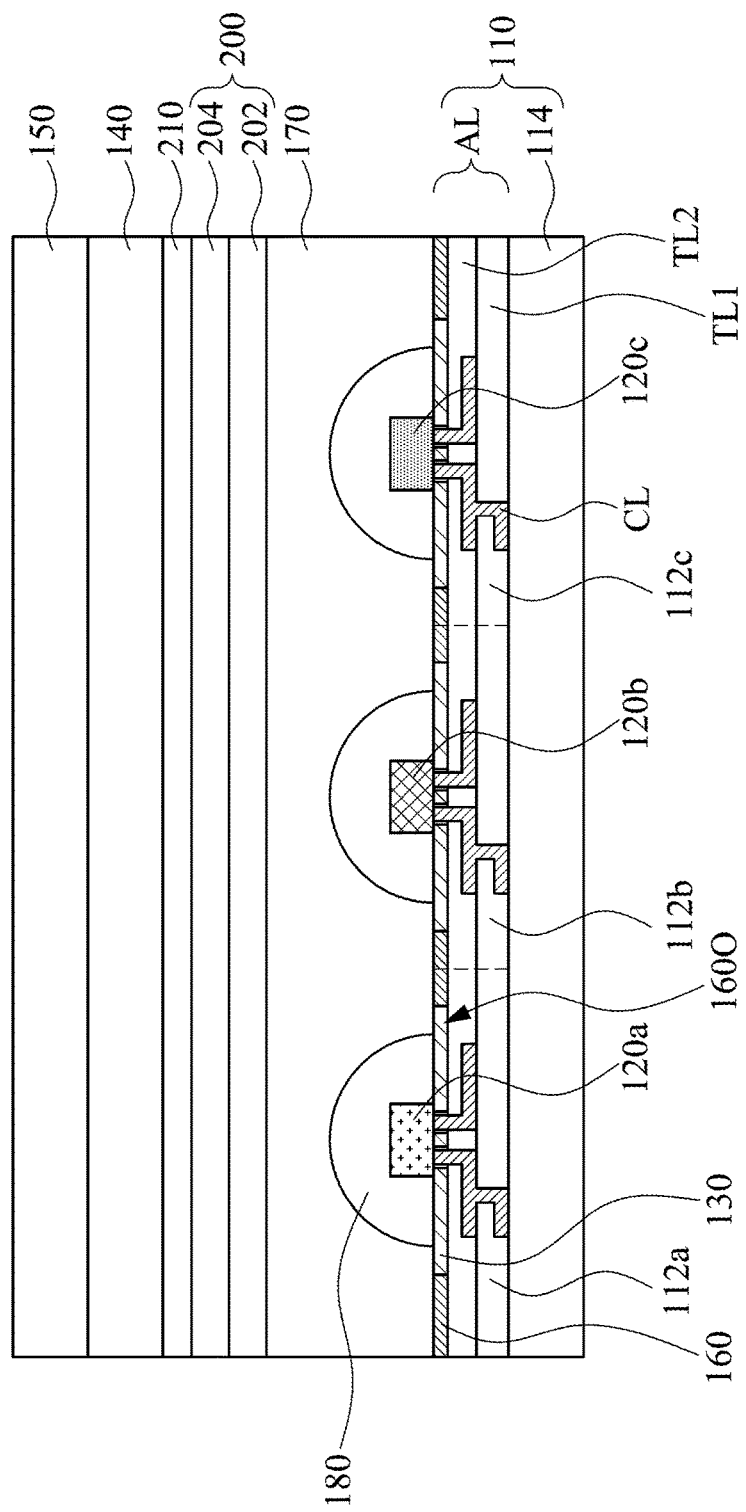
FIG. 11 is a cross-sectional view of a display device according to some embodiments of the present disclosure.

FIG. 11 is a cross-sectional view of a display device according to some embodiments of the present disclosure. The present embodiments are similar to that of FIG. 10, and the difference between the present embodiments and that of FIG. 10 is that: in the present embodiments, the reflective layer 130 is on a side of the array control circuit AL facing the micro LED chips 120a-120c, thereby enhancing the output light intensity. As aforementioned, materials of the reflective layer 130 may be silver, copper, aluminum, nickel, and so on. The reflectance of the reflective layer 130 may be greater than 60%, or preferably, greater than 80%. The reflective layer 130 may be formed by deposition methods.

In the present embodiments, by oxidation reaction, some portions of the reflective layer 130 are blackened, and turned into the light-shielding layers 160. In some other embodiments, the light-shielding layers 160 may be formed by methods such as etching and deposition. The light-shielding layers 160 may be between two adjacent sub-pixel circuits 112a-112c for preventing color mixing. Alternatively, in some other embodiments, the light-shielding layers 160 are between two adjacent sub-pixel circuits 112a-112c (referring to FIG. 3). The reflective layer 130 and the light-shielding layers 160 are formed at the same layer herein, but it should not limit the scope of the present disclosure. In other embodiments, the light-shielding layers 160 may be over the reflective layer 130.

Herein, the micro LED chips 120a-120c of different colors are used, thereby omitting the color filter film. The touch sensing layer 140 may be directly disposed on the transparent cover 150, thereby reducing the overall thickness. However, it should not limit the scope of the present disclosure. In some other embodiments, the color filter film may be over the transparent cover 150.

The array control circuit AL is formed from conductive lines CL and transparent insulating layers TL1 and TL2. The conductive lines CL may be the metal layer or transparent conductive materials mentioned previously. The conductive lines CL are separated from the reflective layer 130, and not in contact with the reflective layer 130. A portion of the conductive lines CL may act as aforementioned electrodes 112E, and be connected with the chips 120a-120c. Another portion of the conductive lines CL are connected to a controlling system, such as a driving circuit. It is noted that, the configuration of the array control circuit AL is applicable to any one of the previous embodiments.

Herein, the touch sensing layer 140 is directly over the transparent cover 150. The display device 100 may include a water vapor barrier layer 200 and an adhesive layer 210 between the optical adhesive 170 and the touch sensing layer 140. A WVTR of the water vapor barrier layer 200 may be less than that of other layers (e.g., the optical adhesive 170, the package layer 180, and the adhesive layer 210). For example, the water vapor barrier layer 200 may include organic, inorganic materials, or the alternating stacked layers thereof, for blocking the water vapor. For example, the water vapor barrier layer 200 includes an inorganic material layer 202 (e.g. $SiO_xN_y$) and an organic material layer 204. WVTRs of the inorganic material layer 202 and the organic material layer 204 are less than those of other layers (e.g., the optical adhesive 170, the package layer 180, and the adhesive layer 210). Herein, the example is illustrated with a single-layer inorganic material layer 202 and a single-layer organic material layer 204, but it should not limit the scope of the present disclosure. In some other embodiments, the water vapor barrier layer 200 may include plural inorganic material layers 202 and plural organic material layers 204, which may be alternatingly stacked. Herein, the adhesive layer 210 is configured to attach the water vapor barrier layer 200 and the touch sensing layer 140. The adhesive layer 210 may be optical adhesive, materials of which may be the same as or different from that of the optical adhesive 170.

In some other embodiments, the touch sensing layer 140 may be disposed on a side of the water vapor barrier layer facing the transparent cover 150, and the touch sensing layer 140 is bonded to the transparent cover 150 through adhesives. Other details of the present embodiments are similar to those aforementioned, and not repeated herein.

Figure 12:
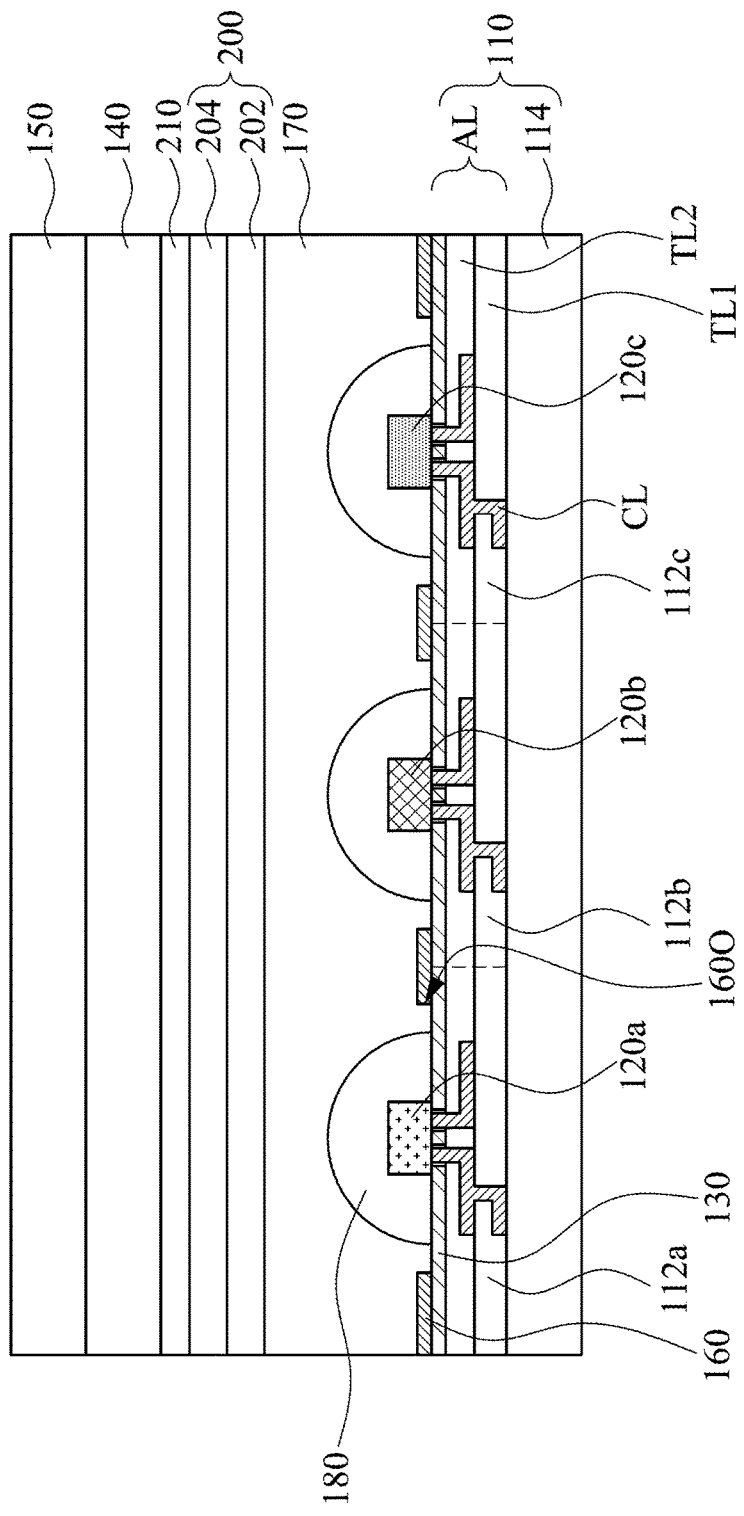
FIG. 12 is a cross-sectional view of a display device according to some embodiments of the present disclosure.

FIG. 12 is a cross-sectional view of a display device 100 according to some embodiments of the present disclosure. The present embodiments are similar to that of FIG. 11, and the difference between the present embodiments and that of FIG. 11 is that: in the present embodiments, the light-shielding layer 160 is over the reflective layer 130. Herein, the openings 160O of the light-shielding layer 160 expose the reflective layer 130, but the reflective layer 130 is not directly in the openings 160O of the light-shielding layer 160. Other details of the present embodiments are similar to those aforementioned, and not repeated herein.

In plural embodiments of the present disclosure, lights emitted from the micro LED chips are reflected by the reflective layer and transmitted through the backside of the display substrate. Herein, the touch sensing layer may be designed on the backside of the display substrate, thereby omitting additional configuration for substrates. Alternatively, display substrates may also act as a cover for the display device. In addition, it is designed that the package layer has the micro-structures such that the reflective layer has corresponding micro-structures, thereby increasing the utilization rates of lights.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display device, comprising:
   a display substrate comprising at least one sub-pixel circuit;
   at least one micro light-emitting diode (LED) chip electrically connected to said at least one sub-pixel circuit;
   at least one reflective layer, wherein the micro LED chip is at least partially disposed between the reflective layer and the sub-pixel circuit; and
   a dielectric package layer wrapping around the micro LED chip, wherein the dielectric package layer isolates the micro LED chip from the reflective layer, the dielectric package layer comprises a plurality of micro-structures, and the reflective layer covers the micro-structures and has a plurality of corresponding reflective micro-structures.

2. The display device of claim 1, further comprising:
   a transparent cover, wherein the display substrate is between the transparent cover and the micro LED chip.

3. The display device of claim 1, wherein a plurality of said at least one micro LED chips comprise a red LED chip, a green LED chip, and a blue LED chip.

4. The display device of claim 1, further comprising:
   a color filter film comprising at least one red color filter unit, at least one green color filter unit, and at least one blue color filter unit disposed respectively corresponding to a plurality of said at least one sub-pixel circuits.

5. The display device of claim 4, wherein a plurality of said at least one micro LED chips have the same emission spectrum and are disposed corresponding to the sub-pixel circuits, respectively.

6. The display device of claim 1, wherein a plurality of said at least one micro LED chips are between a plurality of said at least one reflective layers and a plurality of said at least one sub-pixel circuits respectively, and the reflective layers are separated from each other.

7. The display device of claim 1, wherein a plurality of said at least one micro LED chips are between a plurality of said at least one reflective layers and a plurality of said at least one sub-pixel circuits respectively, and the reflective layers are connected with each other.

8. The display device of claim 1, wherein the display substrate comprises:
   a substrate having a first surface and a second surface, wherein the first surface is closer to the micro LED chip than the second surface is; and
   an array control circuit configured to control a plurality of said at least one sub-pixel circuits, wherein the array control circuit is disposed on the first surface of the substrate.

9. The display device of claim 8, further comprising:
   a touch sensing layer on the second surface of the substrate.

10. The display device of claim 1, further comprising:
    a light-shielding layer covering a portion of the display substrate, wherein the light-shielding layer does not cover at least a portion of the sub-pixel circuit.

11. The display device of claim 1, further comprising:
    a light-shielding layer having at least one opening corresponding to said at least one sub-pixel circuit, wherein the reflective layer entirely covers the opening of the light shielding layer.

12. A display device, comprising:
    a display substrate comprising at least one sub-pixel circuit;
    at least one micro light-emitting diode (LED) chip electrically connected to said at least one sub-pixel circuit;
    a dielectric package layer wrapping around the micro LED chip, wherein dielectric package layer comprises a plurality of micro-structures;
    a reflective layer covering the micro-structures and having a plurality of corresponding reflective micro-structures; and
    a light-shielding layer having at least one opening corresponding to said at least one sub-pixel circuit, wherein the reflective layer is in direct contact with the light-shielding layer, and the at least one opening of the light-shielding layer exposes the reflective layer.

13. The display device of claim 12, wherein at least a portion of the reflective layer is in the at least one opening of the light-shielding layer.

14. The display device of claim 12, wherein the reflective layer is between the display substrate and the micro LED chip.

15. The display device of claim 12, wherein the micro LED chip is between the display substrate and the reflective layer.

16. The display device of claim 12, wherein the dielectric package layer isolates the micro LED chip from the reflective layer.

* * * * *